United States Patent [19]

Sakurai et al.

[11] Patent Number: 4,899,206

[45] Date of Patent: Feb. 6, 1990

[54] SEMICONDUCTOR DEVICE

[75] Inventors: Hiromi Sakurai; Yoichi Akasaka, both of Hyogo, Japan

[73] Assignee: Mitsubishi Denki Kabushiki Kaisha, Tokyo, Japan

[21] Appl. No.: 717,597

[22] Filed: Apr. 1, 1985

Related U.S. Application Data

[63] Continuation-in-part of Ser. No. 374,865, May 4, 1982.

[30] Foreign Application Priority Data

| May 6, 1981 | [JP] | Japan | 56-69561 |
| May 6, 1981 | [JP] | Japan | 56-69562 |
| May 6, 1981 | [JP] | Japan | 56-69563 |
| May 6, 1981 | [JP] | Japan | 56-69564 |

[51] Int. Cl.$^4$ .................. H01L 23/54; H01L 21/88
[52] U.S. Cl. ........................... 357/67; 357/71
[58] Field of Search ............ 357/67, 71, 2, 91; 148/1.5; 29/576 B

[56] References Cited

U.S. PATENT DOCUMENTS

| 3,631,305 | 12/1971 | Bhatt et al. | 357/67 |
| 3,743,894 | 7/1973 | Hall et al. | 357/67 |
| 3,879,804 | 4/1975 | Ames et al. | 357/67 |
| 3,887,994 | 6/1975 | Ku et al. | 357/91 |
| 4,242,698 | 12/1980 | Ghate et al. | 357/715 S X |
| 4,330,343 | 5/1982 | Christou et al. | 357/91 |

OTHER PUBLICATIONS

"Effects of Al Films on Ion—Implanted Si", Lee et al.—Appl. Phys. Letts., vol. 20. No. 2, Jan. 15, 1972, pp. 73–75.

"Enhanced Migration of Implanted Sb and In in Si Covered with Evaporated Al"—Lee et al.—Appl. Phys. Lett., vol. 20, No. 2, Jan. 15, 1972, pp. 76–77.

"Prevention of Corrosion of Copper by Ion Implantation"—Crowder—IBM Tech Disclosure Bulletin, vol. 14, No. 1, 6-1971, p. 198.

"Eliminating Formation of Hillocks During Annealing of Aluminum-Copper Films"—d'Heurle et al.—IBM Tech. Disclosure Bulletin, vol. 14, No. 6, Nov. 1971, p. 1923.

"Boron Doped Aluminum Conductive Stripes for Semiconductor Devices"—Jun. 1971, IBM Technical Disclosure Bulletin, vol. 14, No. 1—Herdzik et al.—p. 260.

"Thin Film Stripes for Electronic Interconnection"—d'Heurle—IBM Technical Disclosure Bulletin, vol. 14, No. 2, 7-1971, pp. 596–597.

Primary Examiner—Rolf Hille
Assistant Examiner—S. V. Clark
Attorney, Agent, or Firm—Wenderoth, Lind & Ponack

[57] ABSTRACT

Described is a semiconductor device comprising a metal wiring formed on a semiconductor wiring including a device or devices, wherein impurities are injected into the metal wiring by ion implantation for suppressing the whiskers that may otherwise develop during processing of the metal wiring. Shorting among the wiring layers caused by such whiskers may be suppressed and the yield rate and operational reliability of the semiconductor device may be improved.

10 Claims, 3 Drawing Sheets

SEMICONDUCTOR DEVICE

This application is a continuation-in-part, of now abandoned application Ser. No. 374,865, filed May 4, 1982, said parent application 374,865 to be abandoned upon being accorded a filing date for the continuation-in-part application.

BACKGROUND OF THE INVENTION

This invention relates to an improved semiconductor device having a metal wiring formed on a semiconductor wafer including a device or devices. More particularly, it relates to the metal wiring in the semiconductor device adapted to prevent shorting across the wiring caused by hillocks or whiskers that are produced in the multi-layer metal wiring.

With increase in the degree of integration in semiconductor devices such as LSI's or VLSI's, the need for high density packaging technology has also increased. Such higher density packaging is required for increasing the degree of integration and reducing the power consumption as well as the spacing between adjacent wiring layers. With a view to higher density packaging, the tendency is towards using a multi-layer wiring such as twin or three layer wiring. The problem encountered in providing such multi-layer wiring is the formation of needle-like single crystals, called hillocks or whiskers, that are formed in the lower (first or second) wiring layers. For realizing an optimum insulation between the layers, these hillocks or whiskers must be extremely small and be of the order of about 0.1 to 0.5 $\mu$m.

So far, an Al or Al-Cu alloy has been used as wiring metal for a semiconductor device having a multilayer wiring, especially as substrate wiring metal, chiefly by reason of the good adherence of the Al or alloy to an insulating film such as silicon dioxide, and because of the excellent mechanical strength of the resulting wiring. Besides, vacuum deposition and control of film thickness may be made very easily and the overall resistance of the wiring may be reduced with an Al or Al-Cu alloy having higher electrical conductivity. Among the methods known in the art to effect vacuum deposition of aluminium are the Al deposition method by resistance heating, an E-gun evaporation method by melting the aluminium with an electron beam, and a sputtering method by argon sputtering. In the resistance heating, referred to above, an aluminium wire is placed on a filament made of wolfram or tantalum and the filament is heated for melting the aluminium to produce an Al vapor which is deposited in vacuum. In this method, various impurities were mixed into the deposited aluminium film, because the wolfram or tantalum filament has a lower purity than that of aluminium. With the E-gun method, aluminium is melted inside the crucible by means of an electron beam. However, the crucible material is not be expected to be of high quality. In the resistance heating or E-gun methods, impurities exist in the Al film in such a large amount that the problem of whisker formation has not presented itself so seriously.

A high-quality aluminium film, obtained by the sputtering method which uses argon sputtering, has also been used for wiring, for possibly avoiding the adverse effects that the impurities contained in the filament itself or in the crucible material might have on the semiconductor device. With such Al film, the effects of the impurities on the semiconductor device may be reduced, however, with the increased purity in the Al film, the formation of hillocks and whiskers has posed a new problem. For example, with the use of a high-quality Al film as a metal wiring, large hillocks (1 to 2 $\mu$m) and whiskers (1.5 to 5 $\mu$m) are produced during the processing of the wiring and the subsequent wafer process due to repeated heat cycles with accompanying compression and expansion of the material. With the interval between Al wiring layers and the thickness of the insulation film between the first and second wiring layers in LSI's being in general 2 to 3 $\mu$m and 1 to 2 $\mu$m, respectively, even supposing that the hillocks and whiskers are covered by the insulating film, these small projections may not be covered sufficiently by the resist material used for providing through-holes in the interlayer film. Due to pinholes thus produced, the whiskers or hillocks may cause electrical shorting between adjacent layers, resulting in the lower yield rate and reliability of the semiconductor device.

Such tendency may be evident not only with a metal wiring made of aluminium, but with one made of high purity wolfram or tantalum or an alloy based on these metals. In other words, whiskers tend to be produced more easily with an increase in the purity of wiring metal.

In order to cope with the problem of whisker formation, a so-called Al-Si alloy with the Si contents being about 1 to 2 percent has been used as a multi-layer metal wiring. However, at the time of an aluminium etching following the photoengraving, aluminium may be removed by etching, but Si remains as a residue. The Si which has remained as a residue may be dispersed quickly in the Al during Al-Si deposition and segregated in the boundary region between the Al-Si alloy and the substrate (insulating film). Excessive Si residues may cause shorting between adjacent wiring and layers thus imparing the protective function or coverage of the insulating films between the adjacent layers. Thus, when the Al-Si alloy is used in the multi-layer wiring, Si residues on the first layer of the Al-Si alloy must be removed by dry Si etching following Al etchings. This is not practically desirable because not only an additional step is involved in the manufacture process, but an SiN insulating film, subjacent to the Al-Si alloy, is also removed by etching simultaneously with Si etching.

SUMMARY OF THE INVENTION

In view of the foregoing, the present invention contemplates the provision of a semiconductor device having a metal wiring on a semiconductor wafer including a device or devices, wherein impurities are injected by ion implantation into said metal wiring, thereby preventing the electrical shorting from occurring during the processing of the metal wiring and thus elevating the yield rate and operational reliability of the semiconductor device.

By using aluminium as the above impurity, good metal wiring may be obtained without influencing the electrical conductivity of the metal wiring.

DETAILED DESCRIPTION OF THE PREFERRED EMBODIMENTS

Figure 1:
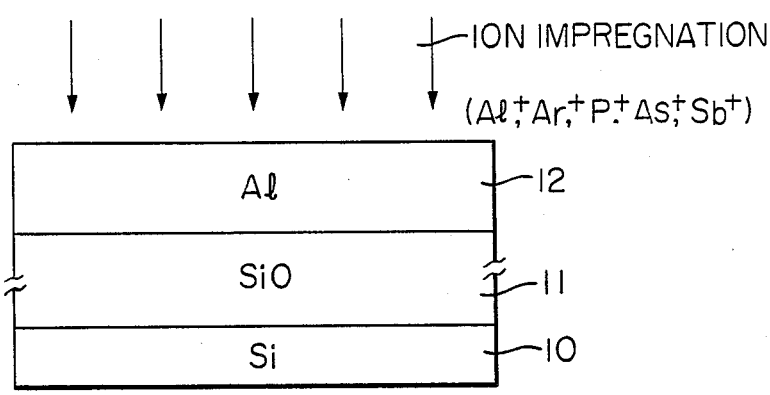
FIG. 1 is a schematic side view showing a preferred embodiment of the present invention.

A preferred embodiment of the present invention is shown in FIG. 1, wherein numeral 10 denotes a Si wafer having a device or devices with PN junctions), numeral 11 an $SiO_2$ film formed on the Si wafer 10, and numeral 12 a high-purity Al film as metallic wiring that is formed on the $SiO_2$ film 11 by sputtering and has a film thickness of about 7000 Å. According to the present embodiment, one of the impurities selected from the group consisting of aluminium ($Al^+$), argon ($Ar^+$), phosphorous ($P^+$), arsenic ($As^+$) and antimony ($Sb^+$) is injected by ionic implantation into the Al film 12 at an injection energy of 150 KeV and an injection volume less than $4\times10^{15}$ cm$^{-2}$, the removal of the whiskers produced during processing of the wiring in the Al film 12.

The reason why such whisker removal is feasible is not precisely known, however, it may be assumed that ion implantation of the above impurities into the Al film is effective to remove the source of whiskers. Such effect of ionic implantation is exhibited, for example, by the conversion into an amorphous state of a single crystal source having a continuous axial direction and disposed directly below the crystal defect in the Al matrix which is the whisker source, and the destruction of the Al single crystal structure also having the continuous axial direction and contiguous to said crystal defect. It has also been discovered that a microcrystalline layer is formed by said impregnation, which microcrystalline layer as well as the amorphous layer prevents the formation of whiskers or hillocks on the surface of the metal wiring. The formation of the amorphous or microcrystalline structure depends upon the type of ions impregnated into the metal wiring, etc.

Among the impurities to be injected by ion implantation, ($Al^+$) is also effective to prevent an increase in the electrical resistance. Further, ($P^+$), ($As^+$) and ($Sb^+$) are the ion species used for formation of PN junctions in semiconductors, while ($Ar^+$) is the ion species used for gettering. Therefore, these species may be injected rather easily for ion implantation of the impurities by employing an artifice well-known in the art.

The method for manufacture of the semiconductor device having the whisker-free metal wiring consists essentially in forming an $SiO_2$ film 11 on the semiconductor (Si) wafer 10 including a device or devices, not shown, then forming a high-purity Al film 12 on the $SiO_2$ film 11 as a first wiring layer and injecting one of the impurities selected from among $Al^+$, $Ar^+$, $P^+$, $As^+$ and $Sb^+$ by ionic implantation at an injection energy of 150 KeV and an injection volume of $4\times10^{15}$ cm$^{-2}$. The Al film is then etched by photoengraving, and the resist is removed. An insulating film between adjacent layers is then formed and through-holes are provided in the film. An Al film is then deposited as a second wiring layer by using the sputtering similarly to the preceding step. The Al film is again subjected to ion implantation. The third and fourth wiring layers may be formed by the repetition of the above manufacture process.

Figure 2:
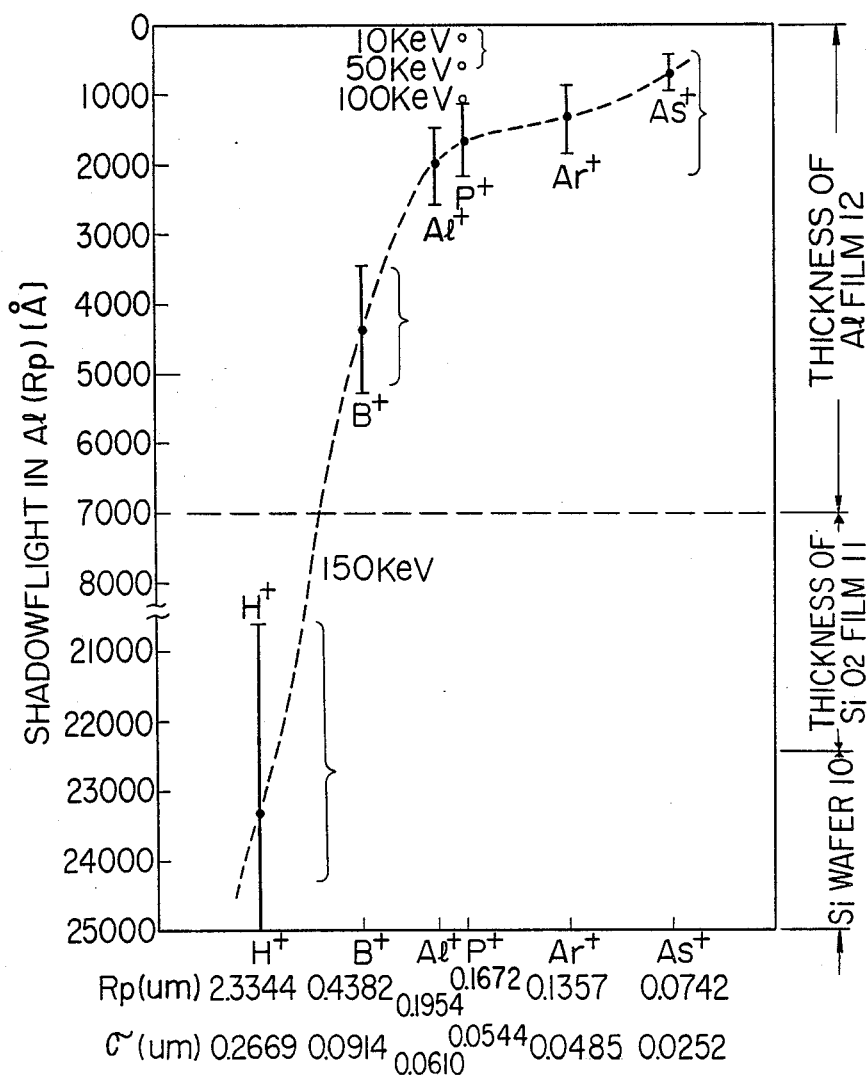
FIG. 2 is a diagram showing the relation between whisker formation and the depth of ion implantation as ascertained by an experiment in connection with the embodiment of FIG. 1.

FIG. 2 shows the result of an experiment conducted for ascertaining the effects of the foregoing embodiment. In FIG. 2 are shown the presence or absence of the whiskers, whisker density and the depth of penetration into the Al film of the impurities $H^+$, $B^+$, $P^+$, $Ar^+$, $As^+$ and $Al^+$, with these impurities being injected into the Al film having the structure shown in FIG. 1 from its surface at an injection energy of 150 KeV and an injection volume of $4\times10^{15}$ cm$^{-2}$ and with the samples thus obtained being subjected to repeated heat cycles in the range between 300° and 25° C.

In FIG. 2, the ion species of the impurities are indicated on the abscissa and the projected range (Rp) of the ions injected into the Al film of the sample shown in FIG. 1. In FIG. 2, Rp and $\sigma$ stand for values of the projected range of the respective ions and the standard deviation thereof respectively. As seen from FIG. 2, $P^+$, $Ar^+$ and $As^+$ resemble one another in such respect that no whisker formation takes place for ion injection to the the depth of about 800 to 2000 Å as indicated at (a) in FIG. 2. These ion species $P^+$, $Ar^+$ and $As^+$ may be injected by implantation rather easily as discussed above. Such prevention of the whisker formation by implantation of the ion species $P^+$, $Ar^+$ and $As^+$ is presumably attributable in part to the fact that these ions are rather heavy in weight, and that the impurities have been injected into a whisker source of 800 to 2000 Å, that is, the depth of ion implantation has been set to 800 to 2000 Å. On the other hand, whisker formation may be observed in cases that $B^+$ has been injected as shown at (c) in FIG. 2 to a depth of about 4500 Å from the surface of the Al film 12 with the film thickness of 7000 Å, that $H^+$ has been injected into a region beyond the Al film 12 indicated at (d) in FIG. 2 and that $P^+$ has been injected to a depth of about 0.01 μm from the surface of Al film 12 as indicated in FIG. 2. Whisker formation for these ion species and depth of penetration testify to the validity of the above surmise.

Figure 3:
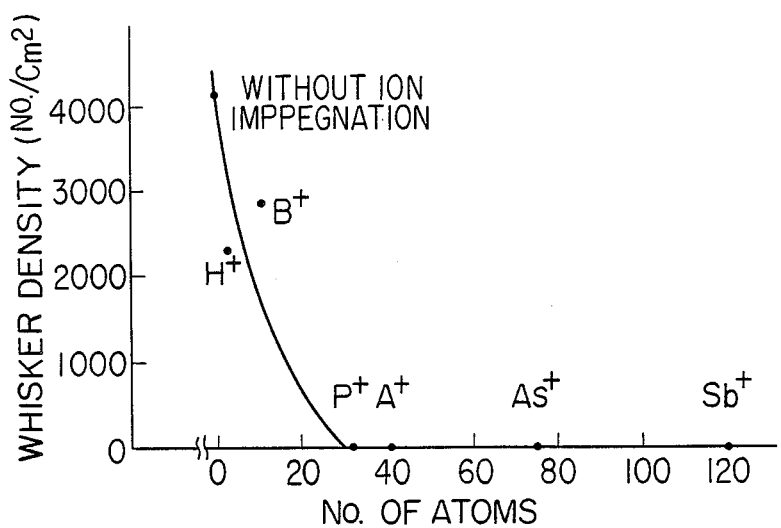
FIG. 3 is a diagram showing the whisker density for each ion species injected as impurities into the Al film.

As a further experiment, ion species $P^+$, $Ar^+$, $As^+$, $H^+$ and $B^+$ were injected as impurities at an injection energy of 150 KeV and an injection volume of $4\times10^{15}$ cm$^2$, and the values of the whisker density for the respective ions were measured. The result is shown in FIG. 3 in comparison with the whisker density for the case where no ion injection has been used. It is seen from FIG. 3 that whisker formation may be observed for such impurities as $B^+$ and $H^+$ but not for $P^+$, $Ar^+$, $Sb^+$ and $As^+$ and that the heavier ions such as $P^+$, $Ar^+$, $Sb^+$ and $As^+$ may be effective to suppress whisker formation.

Injection of $Al^+$ by ion implantation does not give rise to whisker formation. There is also an additional merit that the electrical resistance of the Al film 12 is not affected by such injection.

The reason for suppression of whisker formation by ion impregnation of $Al^+$ may be explained as follows.

The Table 1 below shows the mass of the respective ions.

TABLE 1

| impurities | $P^+$ | $Ar^+$ | $As^+$ | $Al^+$ | $B^+$ |
|---|---|---|---|---|---|
| mass | 31 | 40 | 75 | 27 | 11 |

As seen from this Table 1, since Al+ has a weight which is approximate to that of P+, it has a projected range Rp of 0.1954 μm when injected by ion implantation at 150 KeV and $4 \times 10^{15}$ cm$^{-2}$, as shown in FIG. 2, with the standard deviation σ of the distribution being 0.0610 μm. Whisker formation may be prevented by implanting Al+ to a depth which is rather close to the depth to which P+ is implanted to prevent whisker formation from occuring. Whisker formation may be further prevented by selecting the Al+ injection energy to 130 KeV so that Al+ may be injected by ion implantation to a depth of 0.1683 μm corresponding to an injection energy of 150 KeV for P+ ions.

Moreover, with implantation of one of the impurities selected from the group consisting of Al+, Ar+, P+, As+ and Sb+, it has been confirmed that the semiconductor device may not be affected by several heat cycles in the range of 180° to 500° C. in the writing or by any subsequent steps of the wafer process used in the semiconductor processing system. This means that the limitations on the semiconductor processing system may be partially removed to allow a greater design flexibility.

Figure 4:
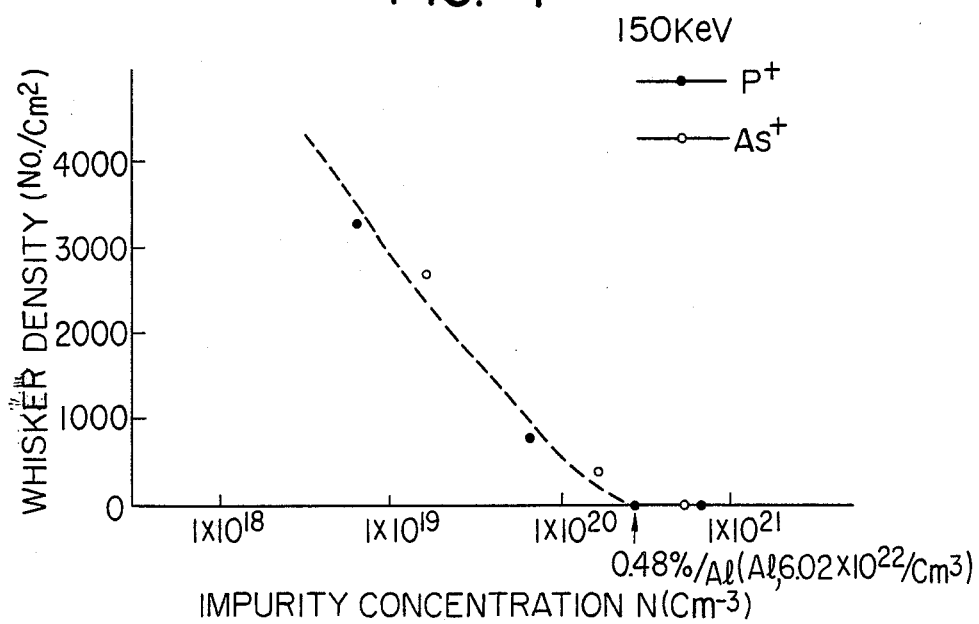
FIG. 4 is a diagram showing the relation between the concentration of the ions injected as impurities and the whisker density.

The relation between the concentration of the impurities injected by ion implantation and whisker density. The result is shown in FIG. 4. In FIG. 4, the impurity concentration N [cm$^{-3}$] for As+ and P+ is plotted on the abscissa and the whisker density (number/cm$^2$) is plotted on the ordinate. According to the present invention, the impurity concentration corresponding to prevention of whisker formation may be effectively obtained by subjecting the sample of the FIG. 1 structure to repeated heat cycles in the range of 300° to 25° C. to produce whiskers in the Al film 12, and checking the relation between the whisker density and the concentration of As+ or P+ injected by ion implantation into the Al film. It is seen from FIG. 4 that P+ and As+ exhibit similar properties and, with both of these impurities, the whisker density is approximately 3000/cm$^3$ for an impurity concentration of $1 \times 10^{19}$/cm$^3$ and is decreased with an increase in the impurity concentration. It is also seen from FIG. 4 that the injection of impurities beyond the concentration of $2.9 \times 10^{20}$/cm$^3$ results in complete suppression of the whisker formation. It is therefore apparent that, since the Al film has a density equal to $6.0 \times 10^{22}$/cm$^3$, whisker formation may be completely suppressed by injecting As+ or P+ in an amount higher than 0.5 percent related to the Al film.

Similar results were obtained with the injection of Ar+ and Sb+ as impurities other than As+ and P+.

It was however found that, with the injection of As+, P+, Ar+ and Sb+ as the ion species, the amount of injection may be preferably in the neighborhood of 0.5 percent in order to maintain the proper resistance value of the Al film 12.

Figure 5:
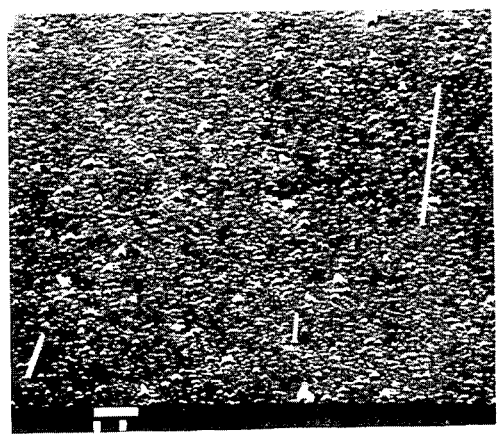
FIG. 5 is an SEM photo showing the Al film on the semiconductor wafer not injected with impurities, the photo being taken following heat cycle tests.
Figure 6:
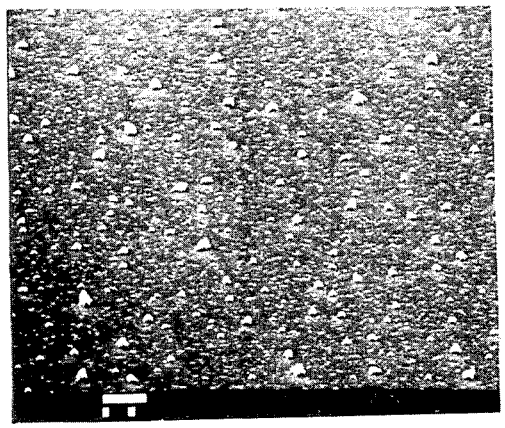
FIG. 6 is an SEM photo showing the same Al film injected with ions, with the photo being taken following heat cycle tests.

FIGS. 5 and 6 are SEM photos which show the difference in whisker formation for the case that the impurities are injected into the high purity Al film 12 of the above samples, and the case wherein such impurities are not injected into the film, the photos being taken after the samples have undergone the heat cycle tests. Thus, FIG. 5 is a SEM photo of a sample including a high purity Al film 12 deposited by sputtering on a semiconductor wafer and subjected to a heat cycle test without advance ion implantation, while FIG. 6 shows a SEM photo of the same sample as above which has undergone ion implantation into the Al film 12 at 150 KeV and $4 \times 10^{15}$ cm$^{-2}$ followed by a heat cycle test. As seen from FIGS. 5 and 6, the Al film 12 to which the ions have been injected are affected by hillocks but are free from whiskers.

As will be apparent from the foregoing, whisker formation in the metal wiring provided in a semiconductor device may be suppressed first by ion implantation of impurities, second by using one of the impurities Al+, Ar+, P+, As+ and Sb+, of which Al+ is effective in that the electrical resistance of the metal wiring may remain unaffected, third by selecting the impurity depth to be 800 to 2000 Å, and fourth by selecting the impurity concentration to be higher than 0.5 percent, with the concentration of about 0.5 percent being effective for As+, P+, Ar+ and Sb+ because then the electrical resistance of the metal wiring remains unaffected. The desired effect of whisker suppression may be procured by using these four methods either singly or in combination.

Although the foregoing description has been made in connection with the metal wiring of Al, an effect similar to that described above may be obtained for Al-Cu alloys liable to whisker formation, provided that Al ions are injected as impurities.

Ion implantation of the impurities as described in connection with the foregoing embodiments may be applied to the formation of whiskers of a similar kind thought to occur in the future with the use of promising wiring materials such as molybdenum or wolfram.

When the Al-Si alloy is used as wiring, the Si residue in the Al-Si alloy may grow to such large Si grains as to cause electrical shorting between adjoining wiring layers. In addition, the electrical resistance may be increased by 10 to 20 percent that of aluminium. However, Al-Si alloys are preferred because of the suppression of the migration or whiskers. On the contrary, the results of heat stress tests have revealed that the Al-Si alloy is more susceptible to hillocks than Al and thus may not be said to be preferred as an optimum multilayer wiring material. The present invention may be applied to the Al-Si alloy used as wiring material since the hillocks may be reduced in size by Al+ injection into the Al-Si alloy by ion implantation, thus preventing a pinhole formation as described above.

Especially noteworthy is the reduction of the whisker density to one half the value prevailing before ion implantation provided that H+ and B+ are used as shown in FIG. 3. Thus it may be said that H+ and B+ are also effective to a certain extent as impurities.

What is claimed is:

1. A semiconductor device having a metal wiring selected from the group consisting of aluminum and an aluminum alloy which is substantially free of whiskers and hillocks, said metal wiring formed on a semiconductor wafer including at least one device, wherein said metal wiring has an amorphous layer of 800 to 2000 Å, and whereby said amorphous layer containing impurities prevents the formation of whiskers and hillocks in said metal wiring, said impurities being selected from the group consisting of aluminum, argon, phosphorous, arsenic and antimony and is present in a concentration of higher than 0.5% in relationship to the metal wiring.

2. The semiconductor device according to claim 1 wherein the metal wiring is arranged in plural layers.

3. The semiconductor device according to claim 1 wherein the metal wiring is of higher purity.

4. The semiconductor device according to claim 1 wherein the metal wiring is high purity aluminum; and wherein an insulating layer is interposed between the metal wiring and the semiconductor wafer.

5. The semiconductor device according to claims 1 or 4 wherein the impurity is aluminum.

6. The semiconductor device according to claims 1 or 4 wherein the impurity is argon.

7. The semiconductor device according to claims 1 or 4 wherein the impurity is phosphorous.

8. The semiconductor device according to claims 1 or 4 wherein the impurity is arsenic.

9. The semiconductor device according to claims 1 or 4 wherein the impurity is antimony.

10. The semiconductor device according to claim 9 wherein the wafer is silicon, the insulating layer is $SiO_2$ and wherein the semiconductor device consists of a plurality of layers of said wafer, insulating layer and metal wiring.

* * * * *